United States Patent
Ho et al.

(10) Patent No.: US 10,497,437 B1
(45) Date of Patent: Dec. 3, 2019

(54) DECODING SCHEME FOR 3D CROSS-POINT MEMORY ARRAY

(71) Applicant: MACRONIX INTERNATIONAL CO., LTD., Hsinchu (TW)

(72) Inventors: Hsin-Yi Ho, Hsinchu (TW); Hsiang-Lan Lung, Ardsley, NY (US)

(73) Assignee: MACRONIX INTERNATIONAL CO., LTD., Hsinchu (TW)

(*) Notice: Subject to any disclaimer, the term of this patent is extended or adjusted under 35 U.S.C. 154(b) by 0 days.

(21) Appl. No.: 16/043,692

(22) Filed: Jul. 24, 2018

(51) Int. Cl.
| | | |
|---|---|---|
| G11C 11/00 | (2006.01) | |
| G11C 13/00 | (2006.01) | |
| G11C 5/06 | (2006.01) | |
| G11C 8/08 | (2006.01) | |
| G11C 8/10 | (2006.01) | |

(52) U.S. Cl.
CPC .......... *G11C 13/0023* (2013.01); *G11C 5/063* (2013.01); *G11C 8/08* (2013.01); *G11C 8/10* (2013.01); *G11C 13/0004* (2013.01); *G11C 13/004* (2013.01); *G11C 13/0007* (2013.01); *G11C 13/0069* (2013.01); *G11C 2213/71* (2013.01)

(58) Field of Classification Search
CPC ............ G11C 13/0004; G11C 16/0483; G11C 13/0069; G11C 16/10; G11C 13/0023; G11C 13/0038; G11C 13/0097; G11C 13/004; G11C 2013/0052; G11C 13/0026; G11C 13/0028; G11C 2013/0092; G11C 13/0033; G11C 16/26; G11C 8/08; G11C 16/08; G11C 16/3427; G11C 13/0061; G11C 16/32; G11C 2013/0073
USPC .............. 365/130, 148, 163, 185.05, 185.11, 365/185.15, 185.17, 185.19, 185.21, 365/185.23, 185.25, 189.011, 230.03
See application file for complete search history.

(56) References Cited

U.S. PATENT DOCUMENTS

| | | |
|---|---|---|
| 5,687,112 A | 11/1997 | Ovshinsky |
| 6,579,760 B1 | 6/2003 | Lung |
| 10,157,671 B1 | 12/2018 | Lung et al. |
| 2017/0213589 A1* | 7/2017 | Guliani .............. G11C 13/0004 |

* cited by examiner

*Primary Examiner* — Thong Q Le
(74) *Attorney, Agent, or Firm* — Haynes Beffel & Wolfeld LLP

(57) ABSTRACT

An integrated circuit includes a three-dimensional cross point memory array having M levels of memory cells disposed in cross points of N first access line layers and P second access line layers. The integrated circuit further comprises first and second sets of first access line drivers. The first set of first access line drivers is operatively coupled to apply a common first operational voltage to selected first access lines in odd first access line layers. The second set of first access line drivers is operatively coupled to apply the common first operational voltage to selected first access lines in even first access layers. A plurality of sets of second access line drivers is operatively configured to apply a second operational voltage to selected second access lines in selected second access line layers.

20 Claims, 11 Drawing Sheets

| VOLTAGE AT FAL1 & FAL3 | VOLTAGE AT FAL2 & FAL4 | VOLTAGE AT SAL 1 & SAL 5 | VOLTAGE AT SAL 2 | VOLTAGE AT SAL 3 | VOLTAGE AT SAL 4 | MEMORY CELL LEVEL READ |
|---|---|---|---|---|---|---|
| 3 | 0 | -3 | 0 | 0 | 0 | 1 |
| 3 | 0 | 0 | -3 | 0 | 0 | 2 |
| 0 | 3 | 0 | -3 | 0 | 0 | 3 |
| 0 | 3 | 0 | 0 | -3 | 0 | 4 |
| 3 | 0 | 0 | 0 | -3 | 0 | 5 |
| 3 | 0 | 0 | 0 | 0 | -3 | 6 |
| 0 | 3 | 0 | 0 | 0 | -3 | 7 |
| 0 | 3 | -3 | 0 | 0 | 0 | 8 |

FIG. 3B

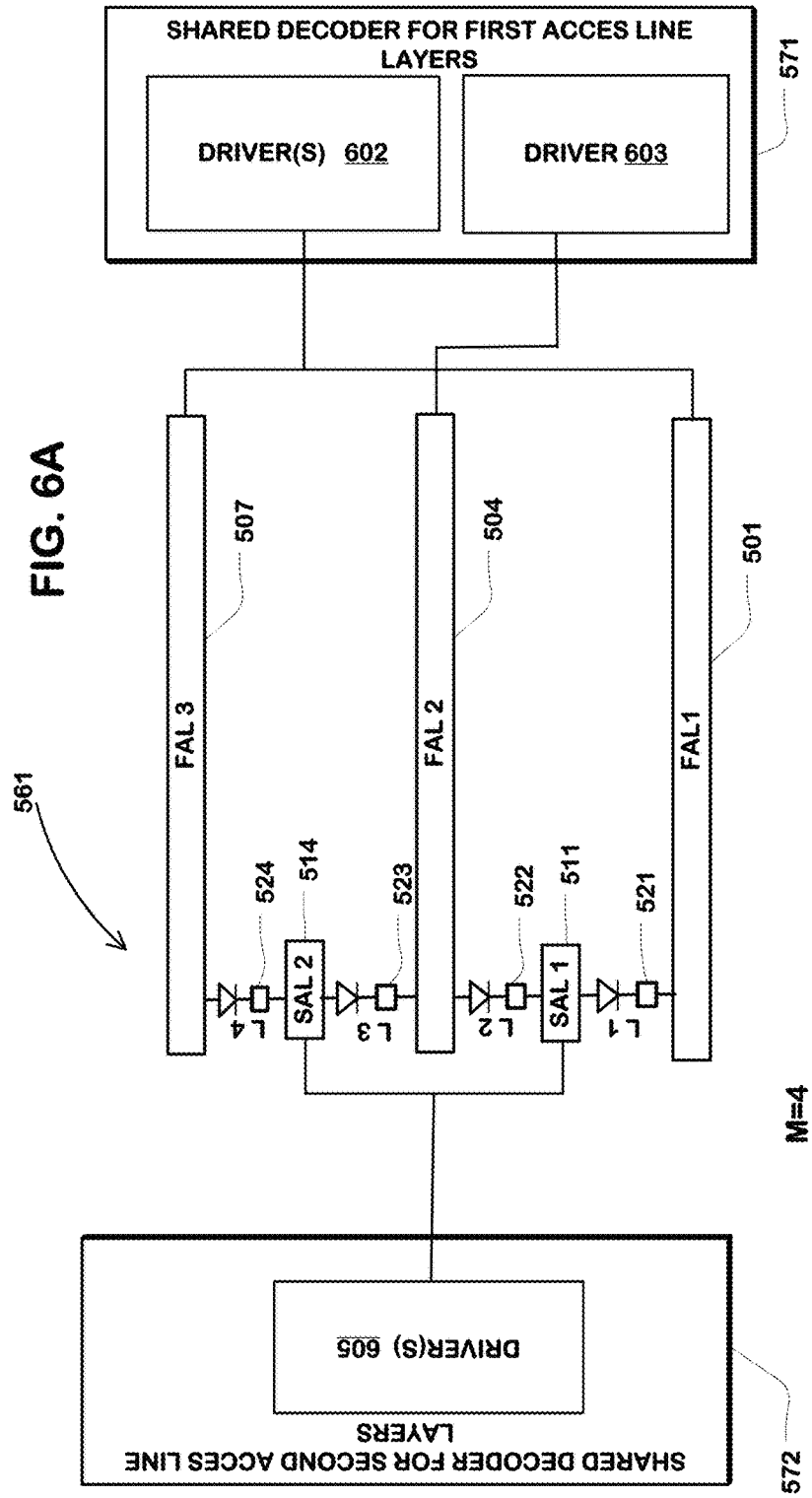

| VOLTAGE AT FAL1, FAL3 & FAL5 | VOLTAGE AT FAL2 & FAL4 | VOLTAGE AT SAL1 & SAL2 | VOLTAGE AT SAL3 & SAL4 | MEMORY CELL LEVEL READ |
|---|---|---|---|---|
| -3 | 0 | 3 | 0 | 1 |
| 0 | 3 | -3 | 0 | 2 |
| 0 | -3 | 3 | 0 | 3 |
| 3 | 0 | -3 | 0 | 4 |
| -3 | 3 | 0 | 3 | 5 |
| 0 | -3 | 0 | -3 | 6 |
| 0 | 0 | 0 | 3 | 7 |
| 3 | 0 | 0 | -3 | 8 |

FIG. 7B

DECODING SCHEME FOR 3D CROSS-POINT MEMORY ARRAY

BACKGROUND

Field

The present invention generally relates to integrated circuits. More specifically, the present invention relates to cross-point memory devices and decoding operations in cross-point memory devices.

Description of Related Art

In three-dimensional (3D) cross-point memory array, multiple memory cells are vertically stacked upon one another to increase the amount of storage in an area available to store data. The memory cells are disposed at cross-points of an alternating arrangement of first access lines (e.g., bit lines or word lines) and second access lines (e.g., word lines or bit lines). Examples of memory cells that can be included in 3D cross-point memory arrays include magnetoresistive random access memory (MRAM), resistive random access memory (RRAM), ferroelectric random access memory (FRAM), silicon-oxide-nitride-oxide semiconductor memory, polymer memory, and phase-change memory.

Various circuitries, sometimes called peripheral circuits, may be used to read data from the memory cells and write data in the memory cells in 3D cross-point memory arrays. Examples include sense amplifiers, decoders, pass gates, drivers, buffers, registers, and the like. The decoders may be connected to drivers for the access lines by which operational voltages are applied to selected memory cells for read and write operations. The area occupied by the decoders is dependent upon the number of first access lines and second access lines in the 3D cross-point memory array. Stacking more memory arrays or increasing the number of levels of memory cells in 3D cross-point memory arrays results in larger decoders. Larger decoders can be complex and require more area.

It is desirable to provide a 3D cross-point memory array with smaller, less complex decoders.

SUMMARY

An integrated circuit is described herein that comprises a 3D cross-point memory array having M, or more, levels of memory cells disposed at cross-points of first and second access lines, in which a decoding circuitry can be shared among the levels.

A 3D cross-point memory array can be characterized as including for the M levels, N first access line layers and P second access line layers interleaved with the N first access line layers, and having memory cells disposed in between. Each first access line layer (n), for n going from 1 to N, includes a plurality of first access lines for corresponding columns of cells. Each second access line layer (p), for p going from 1 to P, includes a plurality of second access lines for corresponding rows of memory cells.

In an embodiment described herein, decoder and driver circuitry is configured to apply operational voltages to first access lines in selected and unselected columns of memory cells, and to apply operational voltages to second access lines in selected and unselected rows of memory cells.

As described herein, the decoding burden for accessing memory cells in the array is reduced by applying common operational voltages to the selected first access lines and common operational voltages to unselected first access lines in a set of first access line layers, the set having more than one member, for a read operation of any cell in the array. Thus, the decoding burden is reduced.

Herein, applying common operational voltages to multiple access lines (i.e., members of a set with more than one member), means that the multiple access lines receive the same operational voltages in a read operation for any cell in the array, and thereby do not need independent decoding for the read.

Thus, to select a particular memory cell in the M levels that is disposed in a cross-point of a particular first access line with a particular second access line, when the particular first access line layer is a member of the set of first access line layers, the decoder and driver circuitry is configured to select a row of memory cells to identify selected and unselected first access lines, a column of memory cells to identify selected and unselected second access lines, the set of first access line layers to identify multiple selected first access line layers including the particular first access line layer and unselected first access line layers, and one or more selected second access line layers including the particular second access line layer, and unselected second access line layers. In an embodiment described, the set of first access line layers includes odd first access line layers (n), where n is odd. Also, the decoder and driver circuitry can be configured to apply common operational voltages to a second set of first access line layers, that includes even first access line layers (n), where n is even.

In some embodiments, the decoder and driver circuitry is configured to apply common operational voltages to selected second access lines in a set of the second access line layers having more than one member. Thus, the decoding burden is reduced for selecting second access line layers as well as for selecting first access line layers. In one example, the set of second access line layers includes a top second access line layer and a bottom second access line layer, including layers (p), where p is 1 and M/2+1 for the M levels of the array.

In some embodiments, the memory cells can include unidirectional elements. In these embodiments, even greater sharing of the decoding burden among access line layers is available. For example, the decoder in the decoder and driver circuitry can be configured to apply combination operational voltages to second access lines in a plurality of sets of second access line layers, where the plurality of sets comprises M/4 set of two second access line layers each, for M levels of the array.

A method for operating a 3D cross-point memory array in the manner discussed above is also disclosed.

Other aspects and advantages of the present technology can be seen on review of the figures, the detailed description, and the claims.

BRIEF DESCRIPTION OF THE DRAWINGS

FIG. 3B illustrates example voltages applied to first and second access lines in a single stack of cells in a 3D cross-point memory array with eight levels of bidirectional memory cells for read operations.

FIG. 6A illustrates an arrangement of first and second access lines and shared first and second access line decoders in a 3D cross-point memory array with four levels of unidirectional memory cells.

FIG. 6B illustrates example voltages applied to first and second access lines in a 3D cross-point memory array with four levels of unidirectional memory cells for read operations.

FIG. 7B illustrates example voltages applied to first and second access lines in a 3D cross-point memory array with eight levels of bidirectional memory cells for read operations.

DETAILED DESCRIPTION

A detailed description of embodiments of the present technology is provided with reference to the FIGS. 1-8.

Figure 1A:
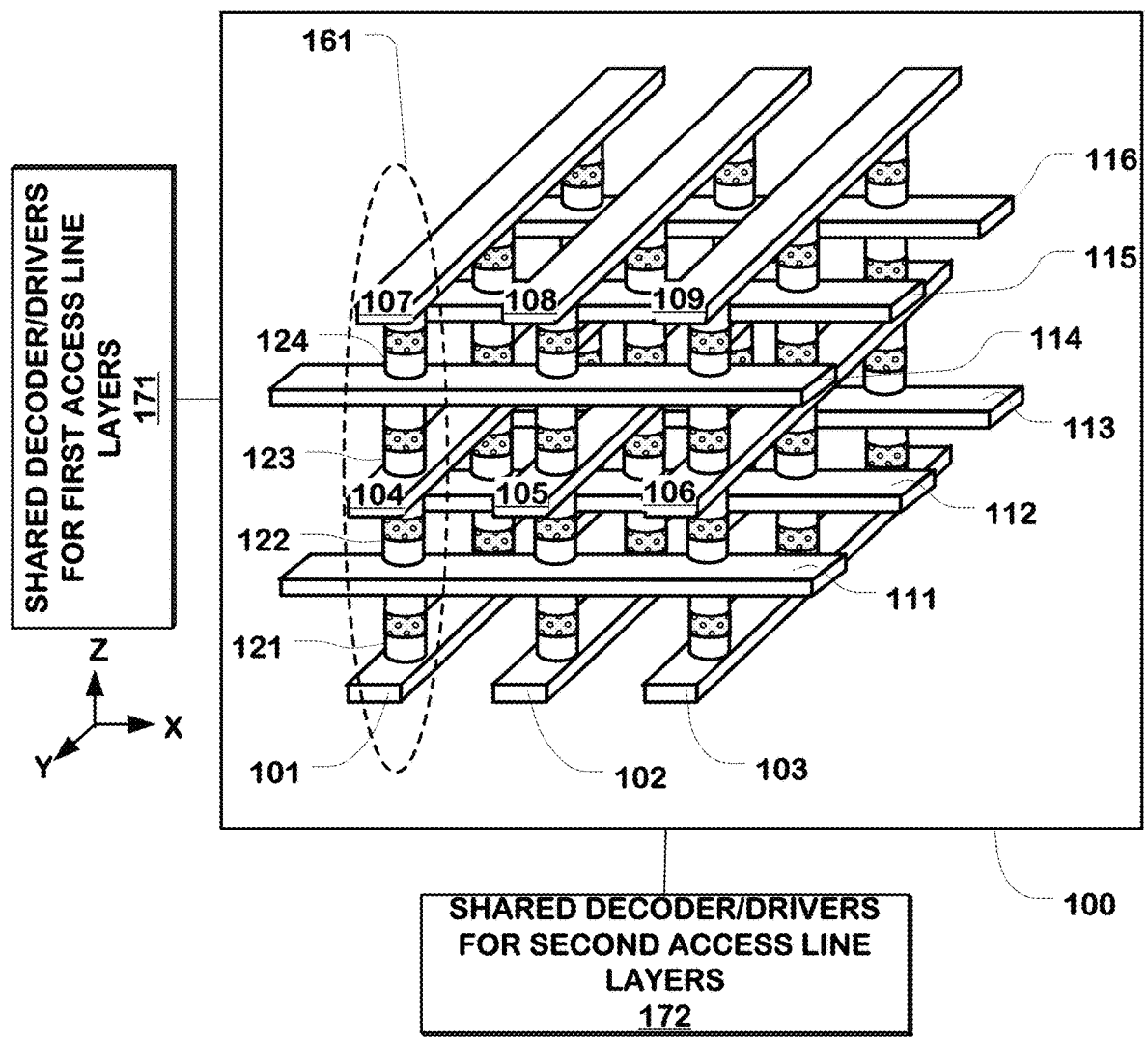
FIGS. 1A and 1B illustrate a 3D cross-point memory array with bidirectional memory cells, and a bidirectional memory cell respectively.

FIG. 1A illustrates a 3D cross-point memory array 100 with bidirectional memory cells. The 3D cross-point memory array 100 includes a plurality of bidirectional memory cells, including bidirectional memory cells 121, 122, 123, 124. The bidirectional memory cells are disposed at cross-points of a plurality of first access lines 111, 112, 113, 114, 115, and 116 arranged in a row direction, and a plurality of second access lines 101, 102, 103, 104, 105, 106, 107, 108, and 109 arranged in a column direction. The row direction and the column direction are orthogonal directions or non-parallel directions so that an array of crosspoints is formed. Each bidirectional memory cell is connected to a particular first access line and a particular second access line. For example, the bidirectional memory cell 121 is connected to the first access line 111 and the second access line 101. A "bidirectional" memory cell allows electric current to flow in both directions between the first access line and the second access line connected to the memory cell. For example, in the bidirectional memory cell 121, an electric current can flow from the first access line 111 (at more positive voltage) to the second access line 101 (at more negative voltage), or from the second access line 101 (at more positive voltage) to the first access line 111 (at more negative voltage).

As described herein, a "stack" of memory cells in an M-level 3D cross-point memory array, such as stack 161, includes M number of memory cells stacked directly on top of each other. The stack 161 includes the bidirectional memory cells 121, 122, 123 and 124 stacked on top of other another. A particular stack is selected by accessing a particular row and a particular column in the multiple layers of cells.

A 3D cross-point memory array implemented in the configuration of FIG. 1A can have many levels, and many first access lines and second access lines in each level for the formation of very high density memory devices. In preferred embodiments, the number of levels of bidirectional cells M may be a multiple of two, e.g., M=2, 4, 8, 16, 32 or 64. Other 3D configurations can also be implemented. A 3D cross-point memory array with M levels of bidirectional memory cells may have N first access line layers, where N=M/2. Each first access line layer (n), with n going from 1 to M/2, includes a plurality of first access lines. The 3D cross-point memory array with M levels may further include P second access line layers interleaved with the N first access line layers, where P=M/2+1. Each second access line layer (p), for p going from 1 to M/2+1, includes a plurality of second access lines.

The 3D cross-point memory array in FIG. 1A comprises M=4 levels of directional memory cells, N=2 first access line layers, and P=3 second access line layers. The first level of bidirectional memory cells in the 3D cross-point memory array is interposed between the second access line layer (SAL1), including the second access lines 101, 102, and 103, and the first access line layer (FAL1), including the first access lines 111, 112, and 113. The second level of bidirectional memory cells in the 3D cross-point memory array is interposed between the first access line layer (FAL1), including the first access lines 111, 112, and 113, and the second access line layer (SAL2), including the second access lines 104, 105, and 106. The third level in the 3D cross-point memory array is interposed between the second access line layer (SAL2), including the second access lines 104, 105, and 106, and the first access line layer (FAL2), including the first access lines 114, 115, and 116. The fourth level in the 3D cross-point memory array is interposed between the first access line layer (FAL2), including the first access lines 114, 115, and 116, and the second access line layer (SAL3), including the second access lines 107, 108, and 109.

Referring to FIG. 1A, the M-level 3D cross-point memory array implemented in the configuration of FIG. 1A is coupled with a decoder and driver circuitry including a shared decoder/drivers for first access line layers and a shared decoder/drivers for second access line layers. The decoders include driver selection circuitry responsive to addresses (not shown in FIG. 1A for clarity sake) that are operatively coupled to drivers, which apply operational voltages to access lines identified by the driver selection circuitry, where the operational voltages have values according to the operations being performed. As described herein, sets of drivers for access lines in more than one layer of access lines are operatively coupled to the decoders, in a shared fashion, so that they apply common operational voltages to their corresponding access lines. This reduces the decoding burden on the device, allowing smaller or less complex decoding circuits. A set of drivers for access lines in more than one layer can include one driver for each access line in each of the multiple layers that are operatively coupled to the decoder to apply the common operational voltage. In an alternative, a set of drivers for access lines in more than one layer can include shared drivers, each shared driver driving the common operational voltage on access lines in multiple layers, including one access line in each of the multiple layers.

In an example, a shared decoder for first access line layers can be operatively coupled to a first set of first access line drivers and a second set of first access line drivers. A given driver in a set of first access line drivers can be coupled to one first access line from a particular row and a particular level of the 3D cross-point memory array. Also, a given driver in a set of first access line drivers can be coupled to one first access line from a particular row in each of a plurality of levels of the 3D cross-point memory array.

The first set of first access line drivers can be operatively coupled to the decoder to apply common operational voltages to selected first access lines in odd first access line layers (n). The second set of first access line drivers can be operatively coupled to the decoder to apply common operational voltages to selected first access lines in even first access layers (n). The shared decoder for second access line layers can be operatively coupled to M/2 sets of second access line drivers configured to apply common operational voltages to selected second access lines in selected second access line layers (p). Each driver in a set of second access line drivers can be coupled to second access lines of a particular column of the M-level 3D cross-point memory array. The first set of second access line drivers from the M/2 sets of second access line drivers can be operatively coupled to apply common operational voltages to selected second access lines in the top and bottom second access line layers (p) where p is 1 and M/2+1. Each set of second access line drivers from the M/2 sets of second access line drivers, other than the first set of second access line drivers, can be operatively coupled to the decoder to apply operational voltages to selected second access lines in one of second access line layer (p), where p is not 1 or M/2+1.

Referring to FIG. 1A, the 3D cross-point array is coupled to and in electrical communication with a shared decoder/drivers 171 for first access line layers and a shared decoder/drivers 172 for second access line layers. The shared decoder/drivers 171 for first access line layers includes a first set of first access line drivers and a second set of first access line drivers. The shared decoder/drivers 172 for second access line layers can include a plurality of sets of second access line drivers. A control circuitry (not shown in FIG. 1A) is coupled to the shared decoder/drivers for first access line layers 171, the shared decoder/drivers for second access line layers 172, and other resources in the integrated circuit to execute write operations, read operations and other memory device operations which require applying sequences of operational voltage pulses to the bidirectional memory cells in the 3D cross-point memory array, where the drivers are selected for specific access lines and specific operational voltages (e.g. read voltages, write voltages, reference voltages and so on) are set by the drivers in response to decoded memory cell addresses and the particular operations being performed.

The shared decoder/drivers for first access line layers 171 comprises first and second sets of first access line drivers. The first set of first access line drivers is operatively coupled to the decoder to apply a common operational voltage to selected first access lines in odd first access line layer (FAL1), including first access lines 111, 112, and 113. The second set of first access line drivers is operatively coupled to apply the common operational voltages to selected first access lines in the even first access layer (FAL2), including first access lines 114, 115, and 116. More details of the coupling between the sets of first access line drivers and the first access lines are described below with reference to FIGS. 2A and 2B.

The shared decoder/drivers 172 for second access line layers comprises M/2=2 sets of second access line drivers. The first set of second access line drivers is operatively coupled to the decoder to apply common operational voltages to selected second access lines in the second access line layer (SAL1), including second access lines 101, 102, and 103, and to selected second access lines in second access line layer (p=M/2+1=3) (SAL3), including second access lines 107, 108, and 109. The second set of second access line drivers is operatively coupled to apply the operational voltages to selected second access lines in the second access line layer (SAL2), including second access lines 104, 105, and 106. More details of the coupling between the sets of second access line drivers and the second access lines are described below with reference to FIGS. 2A and 2B.

Sense amplifiers (not shown in FIG. 1A) can be configured to connect to the first access lines or second access lines. In embodiments of the technology described herein, the sense amplifiers are coupled to one of the first and second access lines on which current source circuits, such as current mirror based load circuits, are connected that limit current during read and write operations.

Figure 1B:
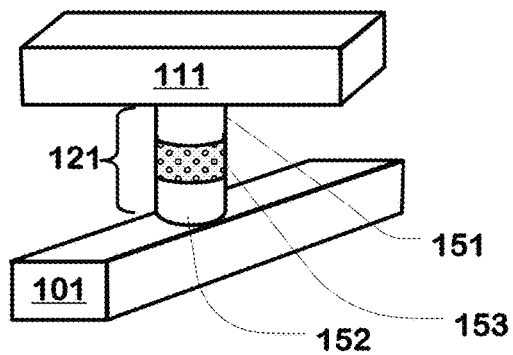

FIG. 1B is a close-up view of an example bidirectional memory cell 121 in FIG. 1A. The memory cell 121 has a first element 151 in contact with the first access line 111 and a second element 152 in contact with the second access line 101. A memory element 153 is disposed between the first element 151 and the second element 152. The first element 151 connects the memory element 153 to the first access line 111. The second element 152 connects the memory element 153 to the second access line 101.

The first element 151 and the second element 152 may comprise a conductive material with a thickness of about 5 to about 50 nm. Example materials for the first element 151 and the second element 152 can be a metal nitride, such as titanium nitride (TiN), tantalum nitride (TaN), tungsten nitride (WN), molybdenum nitride (MoN), niobium nitride (NbN), titanium silicon nitride (TiSiN), titanium aluminum nitride (TiAlN), titanium boron nitride (TiBN), zirconium silicon nitride (ZrSiN), tungsten silicon nitride (WSiN), tungsten boron nitride (WBN), zirconium aluminum nitride (ZrAlN), molybdenum silicon nitride (MoSiN), molybdenum aluminum nitride (MoAlN), tantalum silicon nitride (TaSiN), tantalum aluminum nitride (TaAlN). In addition to metal nitrides, the first element 151 and the second element 152 can comprise doped polysilicon, tungsten (W), copper (Cu), titanium (Ti), molybdenum (Mo), tantalum (Ta), titanium silicide (TiSi), tantalum silicide (TaSi), titanium tungsten (TiW), titanium oxynitride (TiON), titanium aluminum oxynitride (TiAlON), tungsten oxynitride (WON), and tantalum oxynitride (TaON). In some embodiments, the first element 151 can have a different material than the second element 152.

The memory element 153 can comprise a layer of programmable resistance material. The programmable resistance material can have a first resistive value representing bit "0", and a second resistive value representing bit "1". In some embodiments, more than two resistive values can be used to store multiple bits per cell.

In one embodiment, the memory element 153 comprises a layer of phase change memory material as the programmable resistance material, in series with a switch element. The switch element, for example, can be a two-terminal, bi-directional ovonic threshold switch (OTS), which comprises a chalcogenide material.

In other embodiments, the switch element can comprise other types of devices, including directional devices such as a diode and other bi-directional devices.

In an embodiment including an OTS, a read operation involves applying a voltage across the first access line and second access line that exceeds a threshold of the OTS. In embodiments described herein, operational voltages applied to access line in a read operation include a first voltage, such as +3V, a second voltage, such as −3V, and an intermediate voltage, such as 0V. To read a cell in the cross point of selected first and second access lines, the first and second voltages are applied across the selected first and second access lines, to establish a read potential (e.g., 6V) that exceeds the OTS threshold. The intermediate voltage is applied to unselected access lines. The read potentials in memory cells in the cross points of unselected access lines are 0V (or the difference between the intermediate voltages applied to the different access lines). The voltages on memory cells in the cross points of an unselected access line and a selected access line are one of the differences between the intermediate voltage and the first voltage (e.g., +3V) and the difference between the intermediate voltage and the second voltage (e.g., −3V)

Phase change materials are capable of being switched between a relatively high resistance state, amorphous phase, and a relatively low resistance state, crystalline phase, by application of energy such as heat or an electrical current. Phase change materials are for the memory element 153 can include chalcogenide-based materials and other materials. Chalcogenide alloys comprise combinations of chalcogenides with other materials such as transition metals. A chalcogenide alloy usually contains one or more elements from group IVA of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be for example $Ge_2Sb_2Te_5$, $GeSb_2Te_4$ and $GeSb_4Te_7$. More generally, a transition metal such as chromium (Cr), iron (Fe), nickel (Ni), niobium (Nb), palladium (Pd), platinum (Pt) and mixtures or alloys thereof may be combined with Ge/Sb/Te or Ga/Sb/Te to form a phase change alloy that has programmable resistive properties. Specific examples of memory materials are disclosed in Ovshinsky, U.S. Pat. No. 5,687,112 at columns 11-13, which examples are incorporated by reference. Various phase change memory devices are described in U.S. Pat. No. 6,579,760, entitled SELF-ALIGNED, PROGRAMMABLE PHASE CHANGE MEMORY, incorporated by reference herein.

In one example, an OTS switch element can comprise a layer of chalcogenide selected for use as an ovonic threshold switch, such as $As_2Se_3$, ZnTe, and GeSe, and has, for example, a thickness of about 5 nm to about 25 nm, preferably about 15 nm. In some embodiments, the switch element can comprise a chalcogenide in combination with one or more elements from the group consisting of tellurium (Te), selenium (Se), germanium (Ge), silicon (Si), arsenic (As), titanium (Ti), sulfur (S) and antimony (Sb).

In one embodiment, the memory element 153 may be a resistive random access memory or a ferroelectric random access memory. The programmable resistance material in the memory element 153 may be a metal oxide such as hafnium oxide, magnesium oxide, nickel oxide, niobium oxide, titanium oxide, aluminum oxide, vanadium oxide, tungsten oxide, zinc oxide, or cobalt oxide.

In some embodiments, other resistive memory structures can be implemented, such as metal-oxide resistive memories, magnetic resistive memories, conducting-bridge resistive memories, etc.

The first access lines and the second access lines can comprise a variety of metals, metal-like materials, doped semiconductors, or combinations thereof. Embodiments of the first and second access lines can be implemented using one or more layers of materials like tungsten (W), aluminum (Al), copper (Cu), titanium nitride (TiN), tantalum nitride (TaN), tungsten nitride (WN), doped polysilicon, cobalt silicide (CoSi), Tungsten silicide (WSi), TiN/W/TiN, and other materials. The thicknesses of the first access lines and the second access lines can range from 10 to 100 nm. In other embodiments, the first access lines and the second access lines can be very thin, or much thicker.

Figures 2A, 2B:
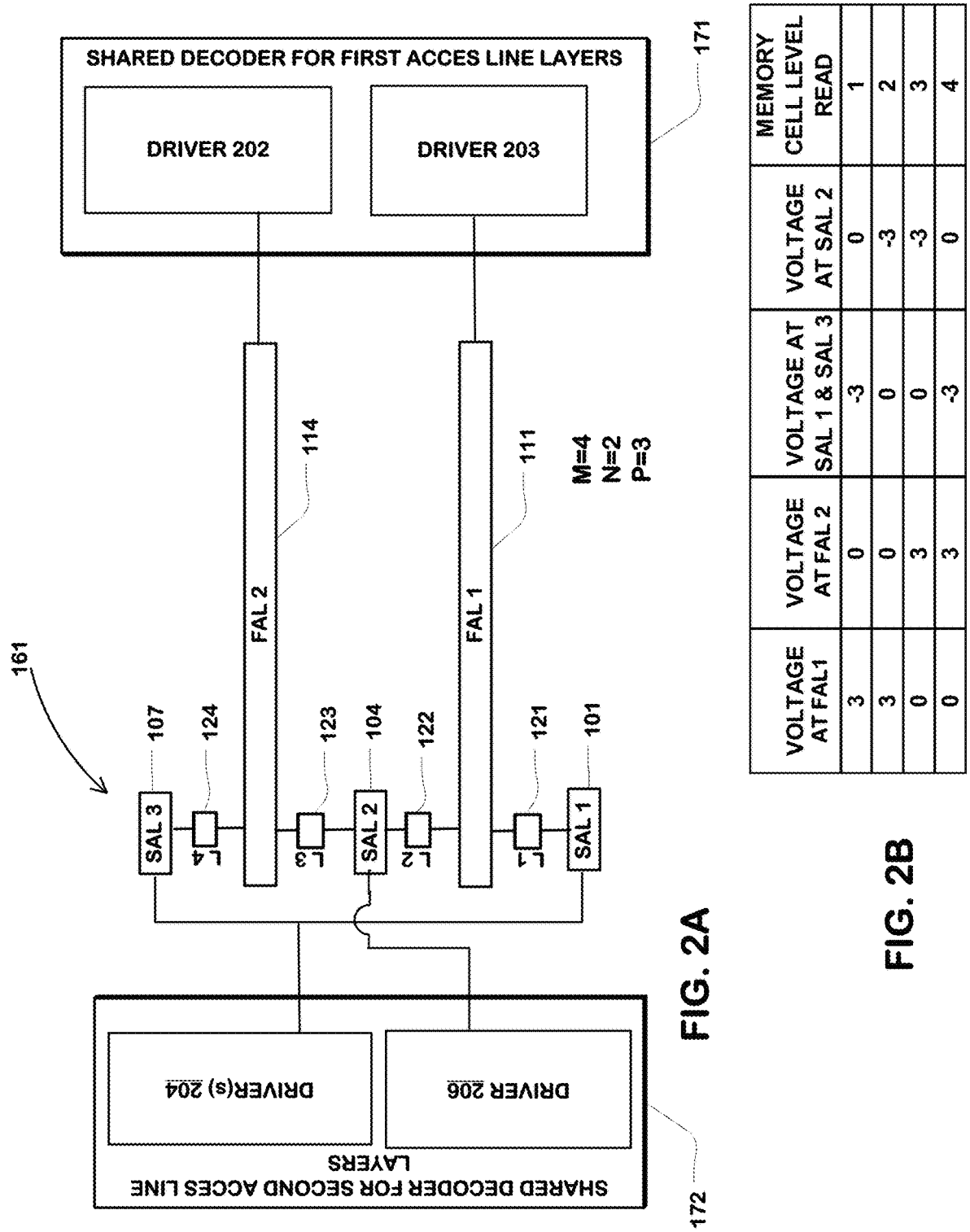
FIG. 2A illustrates an arrangement of first and second access lines in a single stack of cells, with shared first and second access line decoders in a 3D cross-point memory array with four levels of bidirectional memory cells.
FIG. 2B illustrates example voltages applied to first and second access lines in a 3D cross-point memory array with four levels of bidirectional memory cells for read operations.

FIG. 2A illustrates an arrangement of first access lines (FAL) and second access lines (SAL) and shared first and second access line decoders for the stack of bidirectional cells 161 in FIG. 1A. The stack 161 of bidirectional cells is selected by row and column decoders (not shown). The level in the stack is selected by level decoders 171, 172.

In this embodiment, a stack includes the bidirectional memory cells 121, 122, 123 and 124 in four levels of the array, having the same row address and the same column address. The bidirectional memory cells 121, 122, 123 and 124 are at cross-points between N=2 first access line layers and P=3 second access line layers in the different levels. The bidirectional memory cell 121 at the first level L1 is interposed between the second access line 101 of the second access line layer (SAL1) and the first access line 111 of the first access line layer (FAL1). The bidirectional memory cell 122 at the second level L2 is interposed between the first access line 111 of the first access line layer (FAL1) and the second access line 104 of the second access line layer (SAL2). The bidirectional memory cell 123 at the third level L3 is interposed between the second access line 104 of the second access line layer (SAL2) and the first access line 114 of the first access line layer (FAL2). The bidirectional memory cell 124 at the fourth level L4 is interposed between the first access line 114 of the first access line layer (FAL2) and the second access line 107 of the second access line layer (SAL3).

The shared decoder 171 for first access line layers is operatively coupled to first and second sets of first access line drivers, and configured to select the first and second sets of first access line drivers in response to the location of target memory cells and the operations being executed. In the example shown, there are two first access line layers and two sets of first access line drivers. As the number of layers increases, the sets can include more than one member. By selecting sets instead of individual first access lines, the decoding burden is reduced when the number of sets is smaller than the number of first access line layers.

The first set includes a driver 203 for the first access line 111 which corresponds to the row of the selected cell in the first access line layer FAL1. The second set includes driver 202 for the first access line 114 which corresponds to the row of the selected cell in the first access line layer FAL2. The driver 203 from the first set of first access line drivers is coupled to apply operational voltages to the first access line 111 in the odd first access line layer (FAL1). The driver 202 from the second set of first access line drivers is coupled to apply operational voltages to the first access line 114 in the even first access line layer (FAL2). Thus in this example, the first set of first access line layers can include all odd layers, and the second set can include all even layers.

The shared decoder and driver circuitry 172 for second access line layers is operatively coupled to first and second sets of second access line drivers, and configured to select the first and second sets of second access line drivers in response to the location of target memory cells and the operations being executed. Upon selection by the shared decoder and driver circuitry 172 for the second access line layers, a set of second access line drivers apply operational voltages to its corresponding set of second access lines. In the example shown, there are three second access line layers and two sets of second access line drivers. By selecting sets instead of individual second access lines, the decoding burden is reduced when the number of sets is smaller than the number of second access line layers.

Figure 2D:
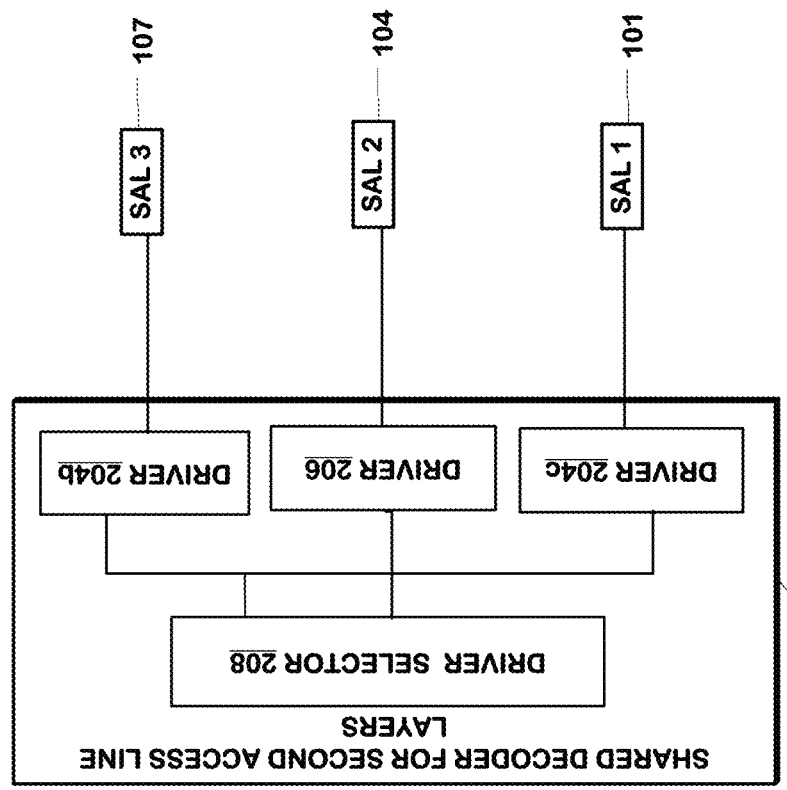
FIG. 2D illustrates a second embodiment of a shared decoder and driver circuitry.
Figure 2C:
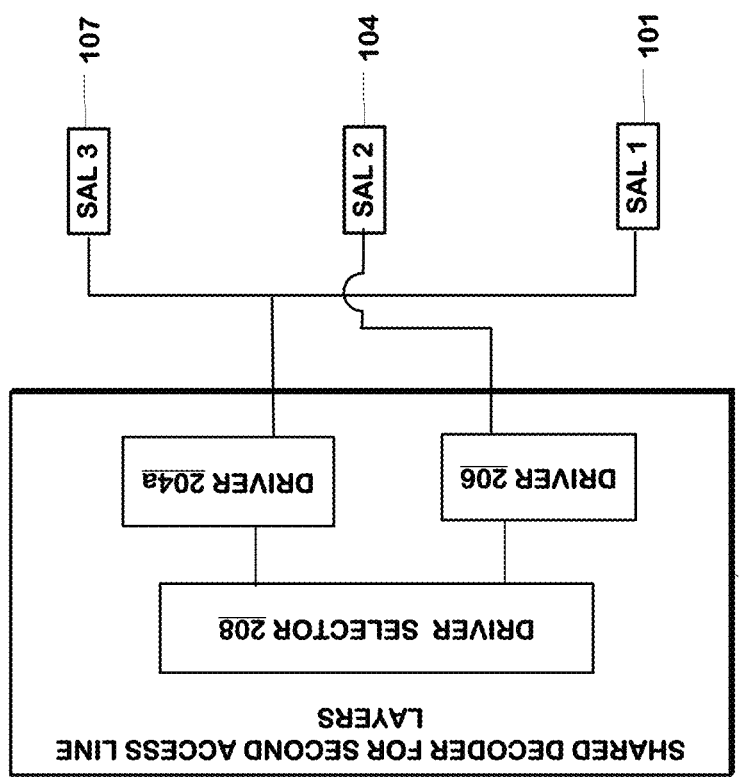
FIG. 2C illustrates a first embodiment of a shared decoder and driver circuitry.

The first set of second access line drivers includes driver or drivers 204 that correspond(s) to the column of the selected cell in the second access line layers SAL1 and SAL3. The driver or drivers 204 apply common operational voltages to a set of second access lines, including the second access line 101 in the second access line layer SAL1 and the second access line 107 in the second access line layer SAL3. In a first embodiment of a shared decoder and driver circuitry, such as the one shown in FIG. 2C, a driver selector 208 is operatively connected to one second access line driver 204a (in this illustration) that is connected to second access lines in a common column (or row) in more than one second access line layer, and drives a common operational voltage to the connected access lines. The driver 204a can be connected to access lines in a common column in all the layers of the set of second access line layers, or to a subset of layers in the set of second access line layers. The driver selector is configured to enable the second access line driver 204a in this example to apply the same (i.e., common) operation voltages the second access line 101 in the second access line layer SAL1 and the second access line 107 in the second access line layer SAL3. In a second embodiment of a shared decoder, such as the one shown in FIG. 2D, the driver selector 208 is operatively connected to two second access line drivers 204b and 204c. Each of the drivers is connected to a second access line in a common row (or column) in one second access line layer. The driver 204b is connected to the second access line 107 in the second access line layer SAL3. The driver 204c is connected to the second access line 101 in the second access line layer SAL1. The driver selector 208 is configured to enable both the drivers 204b and 204c to apply common operation voltages to the second access line 101 in a given row in the second access line layer SAL1 and the second access line 107 in the given row in the second access line layer SAL3. The first embodiment of the shared decoder and driver circuitry occupies less area than the second embodiment as there are fewer drivers. The second embodiment may require less peripheral circuits as there is a driver responsible for applying the operational voltages to only one of the second access lines in the set of second access line layers. Both the configurations of the first and second embodiments of a shared decoder and driver circuitry as shown in FIG. 2C and FIG. 2D are applicable to any shared decoder in FIGS. 3, 5, 6 and 7, including for first access lines and for second access lines.

The second set of second access line drivers includes driver 206 which corresponds to the column of the selected cell, and is coupled to apply common operational voltages to the second set of second access lines having only one member in this example including the second access line 104 in the second access line layer SAL2.

FIG. 2B illustrates example operational voltages applied in a read operation to first and second access lines for each of the four cells 121-124 in levels L1 to L4 of the stack 161 shown in FIG. 2A. In this example, the drivers 202, 203, 204, 206 are configured to apply +3V, 0V or −3V as the operational voltage depending on the memory cell address decoded for the read operation. Voltages of other magnitudes and polarities can be used as suits particular embodiments. As can be seen in the table of FIG. 2B, common operational voltages are applied to second access lines 101 and 107 at layers SAL1 and SAL3 in all read operations for the array. This reduces the decoding burden for the memory.

In order to read data in the bidirectional memory cell 121 at the first level L1, six volts is applied across the cell by the first access line 111 and the second access line 101, while no more than 3 volts is applied across the other cells in the stack. In order to apply six volts, a common operational voltage of −3V is applied to the second access line 101 of the second access line layer (SAL1), and to the second access line 107 of the second access line layer (SAL3). An operational voltage of 3V is applied to the first access line 111 of the first access line layer (FAL1) by the driver 203 from the first set of first access line drivers. An operational voltage of 0V is applied to the first access line 114 of the first access line layer (FAL2) by the driver 202. An operational voltage of 0V is applied to the second access line 104 of the second access line layer (SAL2) by the driver 206.

In order to read data in the bidirectional memory cell 122 at the second level L2, six volts is applied across the cell by the first access line 111 (FAL1) and the second access line 104 (SAL2), while no more than 3 volts is applied across the other cells in the stack. A common operational voltage of 0V is applied to the second access line 101 (SAL1) and to the second access line 107 (SAL3). An operational voltage of 3V is applied to the first access line 111 of the first access line layer (FAL1) by the driver 203 from the first set of first access line drivers. An operational voltage of 0V is applied to the first access line 114 of the first access line layer (FAL2) by the driver 202. An operational voltage of −3V is applied to the second access line 104 of the second access line layer (SAL2) by the driver 206.

In order to read data in the bidirectional memory cell 123 at the third level L3, six volts is applied across the cell by the first access line 114 (FAL2) and the second access line 104 (SAL2), while no more than 3 volts is applied across the other cells in the stack. A common operational voltage of 0V is applied to the second access line 101 (SAL1), and to the second access line 107 (SAL3). An operational voltage of 0V is applied to the first access line 111 of the first access line layer (FAL1) by the driver 203 from the first set of first access line drivers. An operational voltage of 3V is applied to the first access line 114 of the first access line layer (FAL2) by the driver 202. An operational voltage of −3V is applied to the second access line 104 of the second access line layer (SAL2) by the driver 206.

In order to read data in the bidirectional memory cell 124 at the fourth level L4, six volts is applied across the cell by the first access line 114 (FAL2) and the second access line 107 (SAL3), while no more than 3 volts is applied across the other cells in the stack. A common operational voltage of −3V is applied to the second access line 101 (SAL1), and to the second access line 107 (SAL3). An operational voltage of 0V is applied to the first access line 111 of the first access line layer (FAL1) by the driver 203 from the first set of first access line drivers. An operational voltage of 3V is applied to the first access line 114 of the first access line layer (FAL2) by the driver 202. An operational voltage of 0V is applied to the second access line 104 of the second access line layer (SAL2) by the driver 206.

Figure 3A:
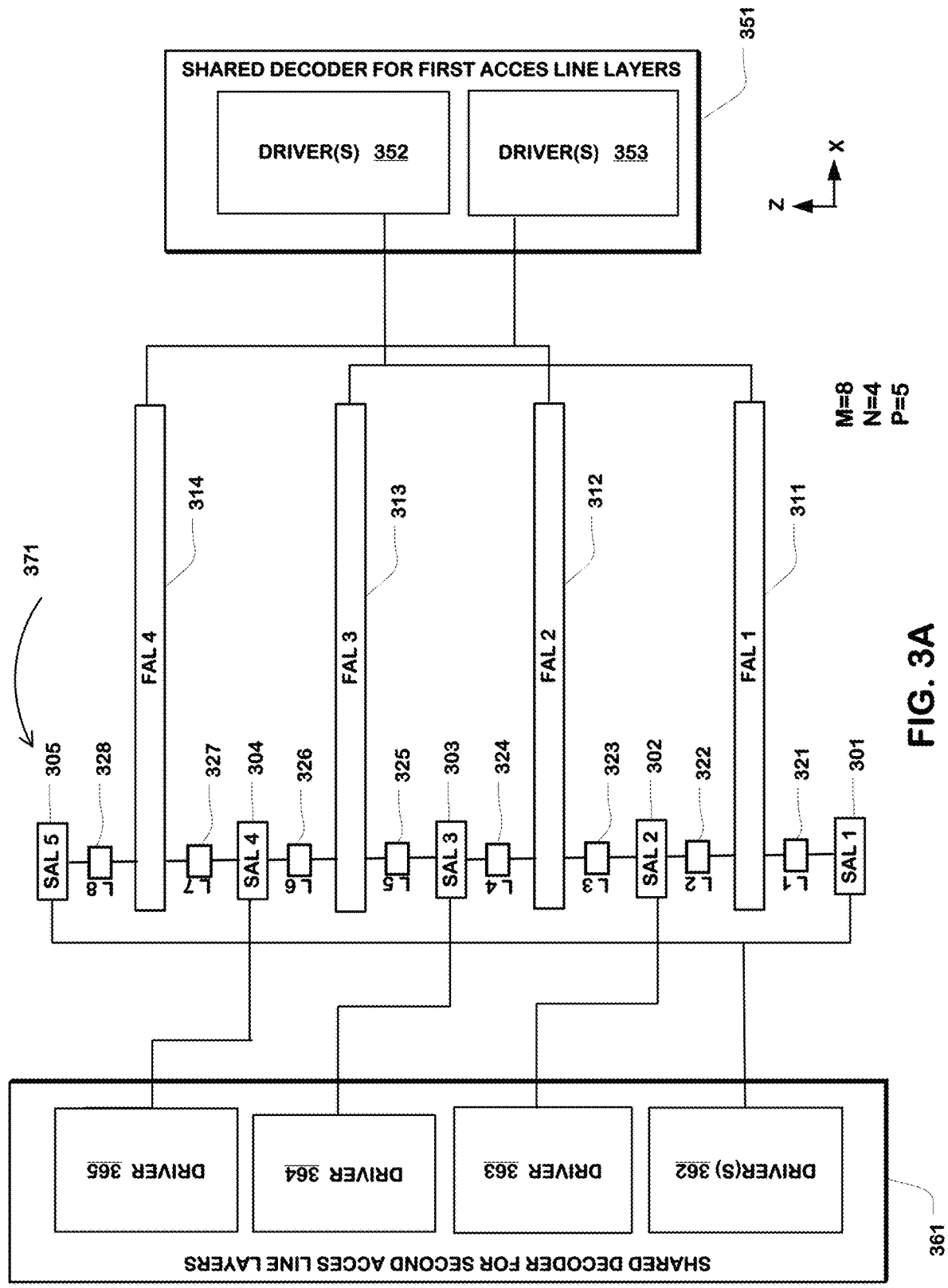
FIG. 3A illustrates an arrangement of first and second access lines and shared first and second access line decoders in a 3D cross-point memory array with eight levels of bidirectional memory cells.

FIG. 3A illustrates an arrangement of first (row) and second (column) access lines and shared first and second access line decoders for a stack 371 of bidirectional cells in a 3D cross-point memory array with eight levels ranging from L1 to L8. The stack of bidirectional cells 371 includes the bidirectional memory cells 321, 322, 323, 324, 325, 326, 327 and 328. The bidirectional memory cells 321, 322, 323, 324, 325, 326, 327 and 328 are at cross-points between the first access lines in N=M/2=4 first access line layers (FAL1 to FAL4) and the second access lines in P=M/2+1=5 second access line layers (SAL1 to SAL5).

The bidirectional memory cell 321 at the first level L1 is interposed between the second access line 301 of the second access line layer (SAL1) and the first access lines 311 of the first access line layer (FAL1). The bidirectional memory cell 322 at the second level L2 is interposed between the first access lines 311 of the first access line layer (FAL1) and the second access line 302 of the second access line layer (SAL2). The bidirectional memory cell 323 at the third level L3 is interposed between the second access line 302 of the second access line layer (SAL2) and the first access lines 312 of the first access line layer (FAL2). The bidirectional memory cell 324 at the fourth level L4 is interposed between the first access lines 312 of the first access line layer (FAL2) and the second access line 303 of the second access line layer (SAL3). The bidirectional memory cell 325 at the fifth level L5 is interposed between the second access line 303 of the second access line layer (SAL3) and the first access lines 313 of the first access line layer (FAL3). The bidirectional memory cell 326 at the sixth level L6 is interposed between the first access lines 313 of the first access line layer (FAL3) and the second access line 304 of the second access line layer (SAL4). The bidirectional memory cell 327 at the seventh level L7 is interposed between the second access line 304 of the second access line layer (SAL4) and the first access lines 314 of the first access line layer (FAL4). The bidirectional memory cell 328 at the eighth level L8 is interposed between the first access lines 314 of the first access line layer (FAL4) and the second access line 305 of the second access line layer (SAL5).

The shared decoder 351 for first access line layers is operatively coupled to select between a first set and a second set of first access line drivers. The first set of first access line drivers includes a driver(s) 352 for first access lines in odd first access line layers (FAL1 and FAL3). The second set of first access line drivers includes a driver(s) 353 for first access lines in even first access line layers (FAL2 and FAL4). The driver(s) 352 is coupled to the decoder to apply a common first operational voltage to the first access line 311 in the odd first access line layer (FAL1), and to the first access line 313 in the odd first access line layer (FAL3). The driver(s) 353 is operatively coupled to the decoder to apply a common first operational voltage to the first access line 312 in the even first access line layer (FAL2) and the first access line 314 in the even first access line layer (FAL4). In a first embodiment of a shared decoder for first access line layers 351, a driver selector can be operatively connected to two first access line drivers for first access lines in a common column (or row) in two different layers. The driver selector can be configured to enable one of the first access line drivers to apply the same (i.e., common) operation voltages to the set of first access lines in a common column in odd first access line layers (FAL1 and FAL3), and the other first access line driver to apply the same operation voltages to the set of first access lines in the common column in even first access line layers (FAL2 and FAL4). In a second embodiment of a shared decoder for first access line layers, a driver selector 208 can be operatively connected to four first access line drivers where each of the drivers is connected to a first access line in the common column in one first access line layer. The driver selector in the second embodiment can be configured to enable the drivers connected to first access lines in the common column in the odd first access line layers to apply common operation voltages to the first access line 311 in the first access line layer FAL1 and the first access line 313 in the first access line layer FAL3, and the drivers connected to first access lines in the even first access line layers to apply common operation voltages to the first access line 312 in the common column in the first access line layer FAL2 and the first access line 314 in the common column in the first access line layer FAL4.

The shared decoder 361 for second access line layers is operatively coupled to select among M/2=4 sets of second access line drivers. The first set of second access line drivers includes a driver(s) 362 for second access lines in second access line layers (SAL1 and SAL5). The second set of second access line drivers includes a driver(s) 363 for second access lines in second access line layer (SAL2). The third set of second access line drivers includes a driver(s) 364 for second access lines in second access line layer (SAL3). The fourth set of second access line drivers includes a driver(s) 365 for second access lines in second access line layer (SAL4). The driver(s) 362 is coupled to the decoder to apply a common operational voltage to the second access line 301 in the second access line layer (SAL1), and to the second access line 305 in the second access line layer (SAL5). The driver(s) 363 is operatively coupled to the decoder to apply an operational voltage to the second access line 302 in the second access line layer (SAL2). The driver(s) 364 is operatively coupled to the decoder to apply an operational voltage to the second access line 303 in the second access line layer (SAL3). The driver(s) 365 is operatively coupled to the decoder to apply an operational voltage to the second access line 304 in the second access line layer (SAL4).

FIG. 3B illustrates example operational voltages applied to first and second access lines in the stack of bidirectional cells 371 with M=8 eight levels as illustrated in FIG. 3A. As can be seen, for a read operation of a memory cell in any level, common operational voltages are applied to sets of first access line layers, including the first set including odd layers FAL1 and FAL3, and the second set including even layers FAL2 and FAL4. Also, for a read operations of a memory cell in any level, common operational voltages are applied to a set of second access line layers, including a first set including the top and bottom layers SAL1 and SAL5, a second set including layer SAL2, a third set including layer SAL3, and a fourth set including layer SAL4. Thus the decoding burden is decreased to selection of two sets of first access line layers from selection of four layers, and selection of four sets of second access line layers from a selection of five layers.

Figure 4:
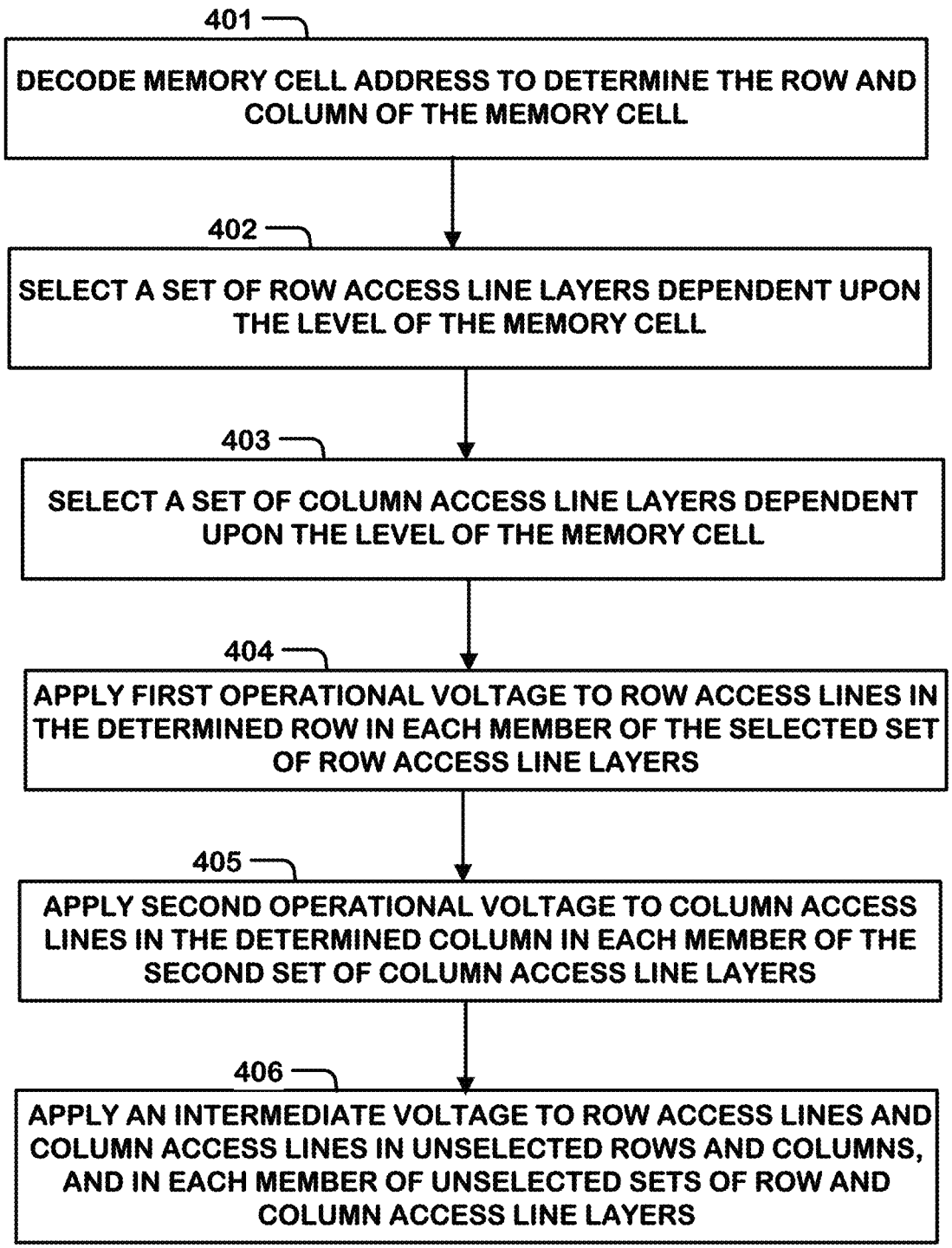
FIG. 4 is a flowchart illustrating a method for reading data in a memory cell in a 3D cross-point memory array with bidirectional memory cells.

FIG. 4 is a flowchart illustrating a method for reading data in a memory cell in a 3D cross-point memory array with shared level decoding. In a read operation, in some embodiments, a read command and address for the memory cell to be read are received. A controller executes a read procedure that involves setting up bias voltages, drivers and sense amplifiers to execute the read. Also, the decoder is used to determine which access lines to drive to accomplish the read operation of the memory cell at a particular address. In a 3D array, a memory cell can be characterized by a row, a column and a level. The method shown in FIG. 4 begins with decoding a memory cell address to determine the row and the column of the memory cell (step 401). Also, the method includes selecting a set of row access line layers (i.e., first access line layers) that depends upon the level of the memory cell (step 402). Also, the method includes selecting a set of column access line layers (i.e., second access line layers) that depends upon the level of the memory cell (step 403). When the number of sets of column access line layers among which the decoder selects is fewer than the number of column access layers, then the decoding burden is reduced.

The read operation includes applying a first operational voltage to a row access line in the determined row in each member of the selected set of row access line layers (step 404). When the number of sets of row access line layers among which the decoder selects is fewer than the number of row access layers, then the decoding burden is reduced.

Also, the method includes applying a second operational voltage to a column access line in the determined column in each member of the selected set of column access line layers (step 405). In addition, the method includes applying an intermediate voltage for memory cells of the type described above, to the row access lines and the column access lines in the unselected rows and columns, and in each member of the unselected set of row and column access line layers (step 406).

In embodiments of the technology described herein, at least one of the set of row access line layers or at least one set of the column access line layers includes more than one member. Accordingly, the decoding burden is reduced.

In embodiments discussed above, either the row access line layers or the column access line layers are grouped into sets that include every odd layer in a first set and every even layer in a second set. The other of the row access line layers or the column access line layers are grouped into sets that include a first set in which the bottom layer and the top layer are members, and additional sets in which one of the individual layers between the top and bottom are included in each set.

Figure 5A:
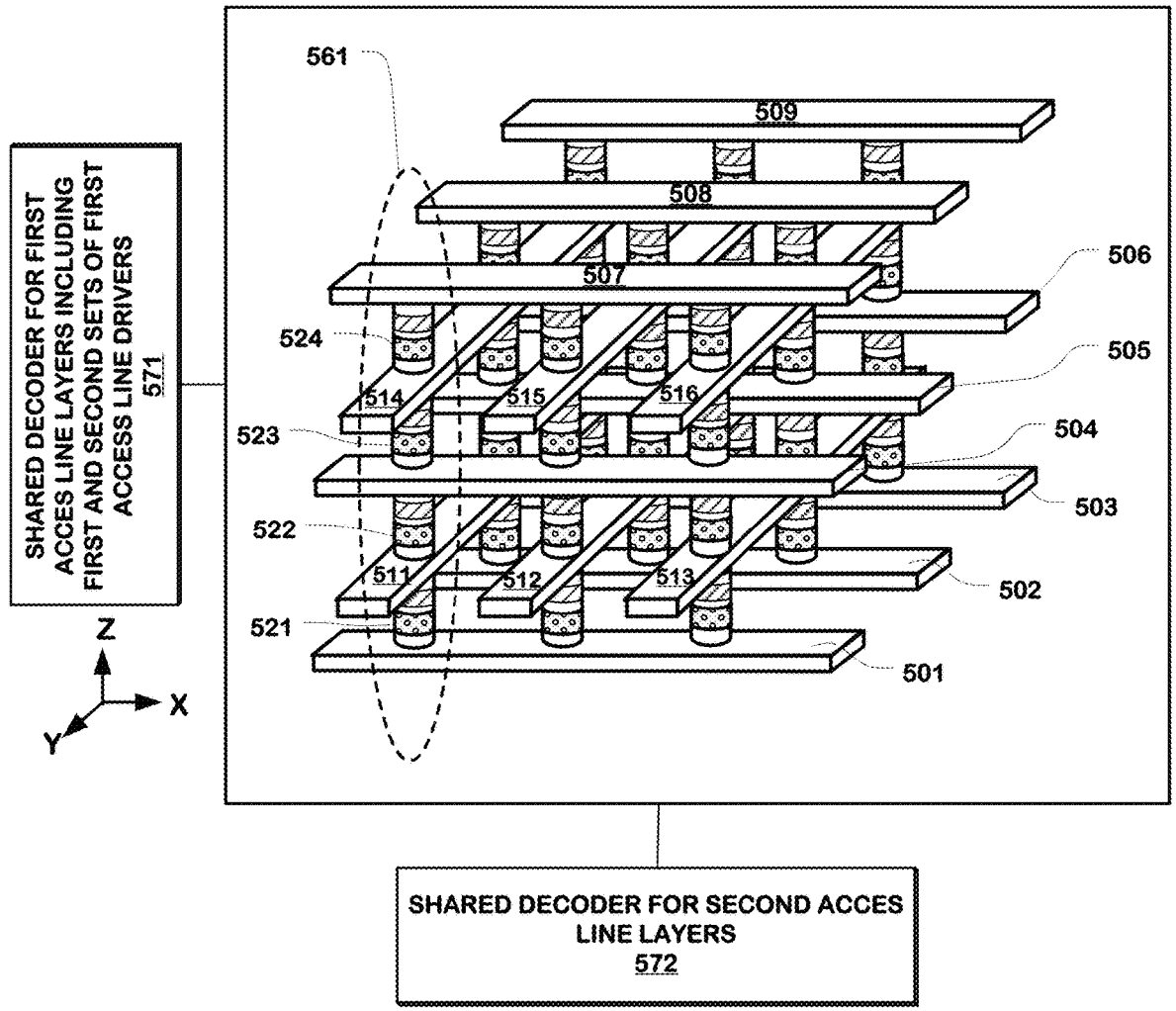
FIGS. 5A and 5B illustrate a 3D cross-point memory array with unidirectional memory cells, and a unidirectional memory cell respectively.

FIG. 5A illustrates a 3D cross-point memory array with unidirectional memory cells. The 3D cross-point array comprises a plurality of unidirectional memory cells, including unidirectional memory cells 521, 522, 523, 524. The unidirectional memory cells are disposed at cross-points of a plurality of first access lines 501, 502, 503, 504, 505, 506, 507, 508, and 509 arranged in a row direction (i.e., row access lines), and a plurality of second access lines 511, 512, 513, 514, 515, and 516 arranged in a column direction (i.e., column access lines). Each unidirectional memory cell is connected to a particular first access line and a particular second access line. For example, the unidirectional memory cell 521 is connected to the first access line 501 and the second access line 511. A "unidirectional" memory cell includes a directional element in addition to a memory element. The directional element allows current to flow in a memory cell in a certain direction between the particular first access line and the particular second access line of the memory cell. Examples of such directional elements include diodes. For example, in the unidirectional memory cell 521, an electric current can flow from the second access line 511 to the first access line 501 but not vice versa. The stack 561 includes the unidirectional memory cells 521, 522, 523 and 524 stacked on top of other another.

A 3D cross-point memory array with unidirectional memory cells implemented in the configuration of FIG. 5A can have many levels and many first access lines and second access lines in each level for the formation of very high density memory devices. In preferred embodiments, the number of levels of unidirectional cells M may be a multiple of two, e.g., M=2, 4, 8, 16, 32 or 64. Other 3D configurations can also be implemented. A 3D cross-point memory array with M levels of unidirectional memory cells can have N first access line layers, where N=M/2+1. Each first access line layer (n), with n going from 1 to M/2+1, can include a plurality of first access lines. The 3D cross-point memory array with M levels can further include P second access line layers interleaved with the N first access line layers, where P=M/2. Each second access line layer (p), for p going from 1 to M/2, can include a plurality of second access lines.

The 3D cross-point memory array in FIG. 5A comprises M=4 levels of directional memory cell, N=3 first access line layers, and P=2 second access line layers. The first level of unidirectional memory cells in the 3D cross-point memory array is interposed between the first access line layer (FAL1), including the first access lines 501, 502, and 503, and the second access line layer (SAL1), including the second access lines 511, 512, and 513. The second level of unidirectional memory cells in the 3D cross-point memory array is interposed between the second access line layer (SAL1), including the second access lines 511, 512, and 513, and the first access line layer (FAL2), including the first access lines 504, 505, and 506. The third level in the 3D cross-point memory array is interposed between the first access line layer (FAL2), including the first access lines 504, 505, and 506, and the second access line layer (SAL2), including the second access lines 514, 515, and 516. The fourth level in the 3D cross-point memory array is interposed between the second access line layer (SAL2), including the second access lines 514, 515, and 516, and the first access line layer (FAL3), including the first access lines 507, 508, and 509.

FIG. 5A shows an M-level 3D cross-point memory array includes a shared decoder 571 for first access line layers and a shared decoder 572 for second access line layers. A control circuitry (not shown in FIG. 5A) is coupled to the shared decoder for first access line layers 571, the shared decoder for second access line layers 572, and other resources in the integrated circuit to execute write operations, read operations and other memory device operations which require applying sequences of voltage pulses to the unidirectional memory cells in the 3D cross-point memory array.

More details about the arrangement of the first access line decoder 571, the second access line decoder 572, and the first and second access lines are described below with reference to FIG. 6A.

Figure 5B:
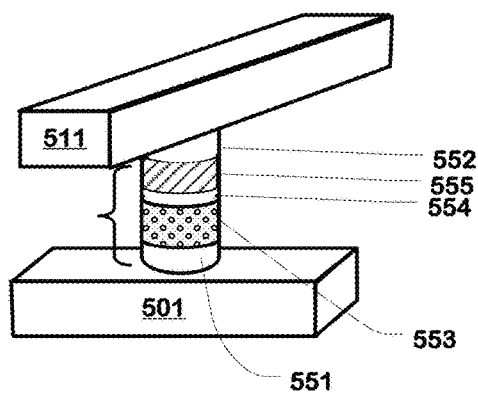

FIG. 5B is a close-up view of an example unidirectional memory cell 521 in FIG. 5A. Memory cell 521 has a first element 551 in contact with the first access line 501 and a second element 552 in contact with the second access line 511. A memory element 553 is disposed between the first element 551 and the middle element 554. A directional element 555 is disposed between the middle element 554 and the second element 552. The first element 551 connects the memory element 553 to the first access line 501. The second element 552 connects the directional element 555 to the second access line 511. In some embodiments, the directional element may be between the middle element and the first element, and the memory element may be between the middle element and the second element.

In the embodiment in FIG. 5B, the directional element allows current to flow from the second element to the first element, but not vice versa. In some embodiments, the directional element may allow current to flow from the first element to the second element, but not vice versa.

The first element 551, the second element 552, and the middle element 554 may comprise a conductive material with a thickness of about 5 to about 50 nm. Example materials are described above in connection with FIG. 1B.

The memory element 553 can comprise a layer of programmable resistance material. The programmable resistance material can have a first resistive value representing bit "0", and a second resistive value representing bit "1". In some embodiments, multiple bits per cell are stored.

In one embodiment, the memory element 553 may be a phase change memory comprising a layer of phase change material as the programmable resistance material, examples of which are described above.

In other embodiments, the memory element 553 may be a resistive random access memory or a ferroelectric random access memory. The programmable resistance material in the memory element 553 may be a metal oxide such as hafnium oxide, magnesium oxide, nickel oxide, niobium oxide, titanium oxide, aluminum oxide, vanadium oxide, tungsten oxide, zinc oxide, or cobalt oxide.

In some embodiments, other resistive memory structures can be implemented, such as metal-oxide resistive memories, magnetic resistive memories, conducting-bridge resistive memories, etc.

The directional element 555, for example, can be a diode.

The first access lines and the second access lines can comprise a variety of metals, metal-like materials, doped semiconductors, or combinations thereof, as described above.

FIG. 6A illustrates an arrangement of first and second access lines and shared first and second access line decoders for a stack of unidirectional cells 561 in a selected row and selected column in an array like that in FIG. 5A. The stack of unidirectional cells 561 includes the unidirectional memory cells 521, 522, 523 and 524 stacked on top of one another. The unidirectional memory cells 521, 522, 523 and 524 are at cross-points between N=3 first access line layers and P=2 second access line layers. The unidirectional memory cell 521 at the first level L1 is interposed between the first access line 501 of the first access line layer (FAL1) and the second access line 511 of the second access line layer (SAL1). The unidirectional memory cell 522 at the second level L2 is interposed between the second access line 511 of the second access line layer (SAL1) and the first access line 504 of the first access line layer (FAL2). The unidirectional memory cell 523 at the third level L3 is interposed between the first access line 504 of the first access line layer (FAL2) and the second access line 514 of the second access line layer (SAL2). The unidirectional memory cell 524 at the fourth level L4 is interposed between the second access line 514 of the second access line layer (SAL2) and the first access line 507 of the first access line layer (FAL3).

The shared decoder 571 for first access line layers is operatively coupled to first and second sets of first access line drivers, and configured to select either the first set or the second set of first access line drivers in response to the location of target memory cells and the operations being executed. In the example shown, there are three first access line layers and two sets of first access line drivers. By selecting sets instead of individual first access lines, the decoding burden is reduced when the number of sets is smaller than the number of first access line layers.

The first set of first access line drivers includes a driver(s) 602 for first access line 501 which corresponds to the row of the selected cell in first access line layer FAL1, and first access line 507 which corresponds to the row of the selected cell in first access line layer FAL3. The second set includes a driver(s) 603 for first access line 504 which corresponds to the row of the selected cell in first access line layer FAL2. The driver(s) 602 from the first set of first access line drivers is operatively coupled to the decoder 571 to apply common operational voltages to odd layers, including to the first access line 501 in the first access line layer FAL1 and to the first access line 507 in the first access line layer FAL3. The driver 603 from the second set of first access line drivers is coupled to the decoder 571 to apply common operational voltages to even layers, the first access line 504 in the first access line layer (FAL2). Thus in this example, the first set of first access line layers can include all odd layers, and the second set can include all even layers.

The shared decoder 572 for second access line layers is operatively coupled to a first set of second access line drivers, and configured to select a set of second access line drivers in response to the location of target memory cells within the block of the array using the decoder 572 and the operations being executed. In the example shown, there are two second access line layers and one set of second access line drivers. By selecting sets instead of individual second access lines, the decoding burden is reduced when the number of sets is smaller than the number of second access line layers.

The first set of second access line drivers includes driver 605 that correspond(s) to the column of the selected cell in second access line layers SAL1 and SAL2.

FIG. 6B illustrates example operational voltages applied to first and second access lines in the stack of unidirectional cells 561 in FIG. 6A for read operations. Voltages of any magnitude and polarity can used as the common first operational voltage and the second operational voltage to read the data in a unidirectional memory cell as long as the common first operational voltage and the second operational voltage create a voltage drop across the memory cell to allow current flow through the directional element to determine resistive state of the memory cell, i.e., determine the bit saved in the resistive cell.

In this example, the drivers 602, 603, 605 are configured to apply one of +3V, 0V and −3V as the operational voltage depending on the decoded memory cell address for the read operation. Voltages of other magnitudes and polarities can be used as suits particular embodiments. As can be seen in the table of FIG. 6B, a common operational voltage is applied to second access lines 511 and 514 at layers SAL1 and SAL2 in all read operations for the array. Also, a common operational voltage is applied to first access lines 501 and 507 at layers FAL1 and FAL3 in some read operations for the array. This reduces the decoding burden for the memory.

In order to read data in the unidirectional memory cell 521 at the first level L1, a forward bias of six volts is applied across the cell by −3V on first access line 501 and +3V on second access line 511, while no more than a forward bias of +3 volts or reverse bias is applied across the other cells in the stack. In order to apply a forward bias of six volts, a common operational voltage of +3V is applied to the second access line 511 of the second access line layer SAL1 and to the second access line 514 of the second access line layer SAL2 by the driver(s) 605. An operational voltage of −3V is applied to the first access line 501 of the first access line layer FAL1 and the first access line 507 of the first access line layer FAL3 by the driver(s) 602. An operational voltage of 0V is applied to the first access line 504 of the first access line layer FAL2 by the driver 603.

In order to read data in the unidirectional memory cell 522 at the second level L2, a forward bias of six volts is applied across the cell by the first access line 504 (FAL2) and the second access line 511 (SAL1), while no more than 3 volts or reverse bias is applied across the other cells in the stack. In order to apply a forward bias of six volts, a common operational voltage of −3V is applied to the second access line 511 (SAL1) and to the second access line 514 (SAL2). An operational voltage of +3V is applied to the first access line 504 of the first access line layer (FAL2) by the driver 603 from the second set of first access line drivers. An operational voltage of 0V is applied to the first access line 501 of the first access line layer (FAL1) and to the first access line 507 of first access line layer FAL3 by the driver(s) 602.

In order to read data in the unidirectional memory cell 523 at the third level L3, a forward bias of six volts is applied across the cell by the first access line 504 (FAL2) and the second access line 514 (SAL2), while no more than 3 volts or reverse bias is applied across the other cells in the stack. In order to apply a forward bias of six volts, a common operational voltage of +3V is applied to the second access line 514 (SAL2) and to the second access line 511 (SAL1). An operational voltage of −3V is applied to the first access line 504 of the first access line layer (FAL2) by the driver 603 from the second set of first access line drivers. An operational voltage of 0V is applied to the first access line 501 of the first access line layer (FAL1) and to the first access line 507 of the first access line layer FAL3 by the driver(s) 602.

In order to read data in the unidirectional memory cell 524 at the fourth level L4, a forward bias of six volts is applied across the cell by the first access line 507 (FAL3) and the second access line 514 (SAL2), while no more than 3 volts or reverse bias is applied across the other cells in the stack. In order to apply a forward bias of six volts, a common operational voltage of −3V is applied to the second access line 514 (SAL2) and to the second access line 511 (SAL1). An operational voltage of 0V is applied to the first access line 504 of the first access line layer (FAL2) by the driver 603 from the second set of first access line drivers. An operational voltage of 3V is applied to the first access line 501 of the first access line layer (FAL1) and to the first access line 507 of the first access line layer FAL3 by the driver(s) 602

Figure 7A:
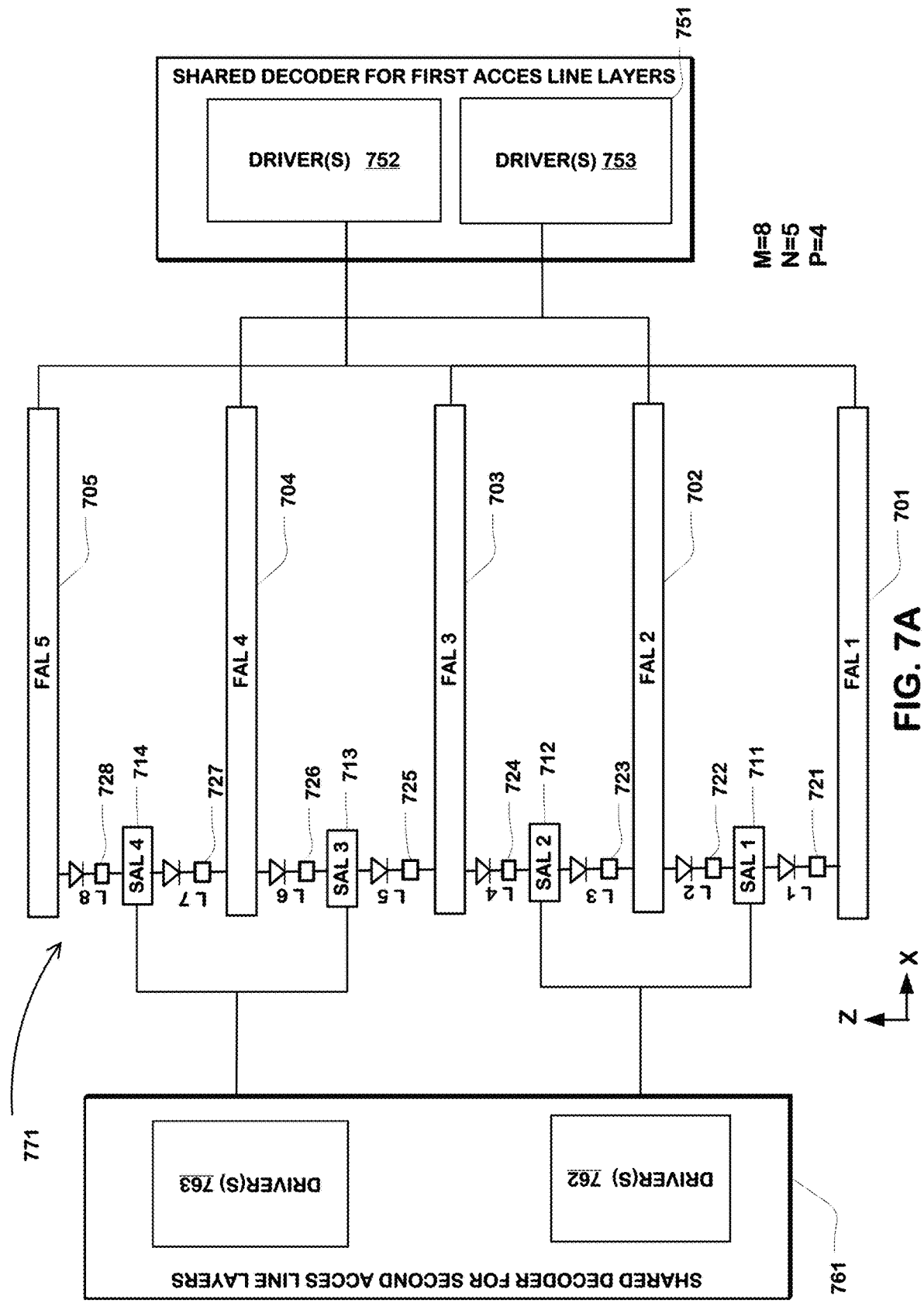
FIG. 7A illustrates an arrangement of first and second access lines and shared first and second access line decoders in a 3D cross-point memory array with eight levels of unidirectional memory cells.

FIG. 7A illustrates an arrangement of first and second access lines and shared first and second access line decoders for a stack 771 of unidirectional cells at a particular row and column in a 3D cross-point memory array with M=8 levels. The stack of unidirectional cells 771 includes the unidirectional memory cells 721, 722, 723, 724, 725, 726, 727 and 728 stacked on top of one another. The unidirectional memory cells 721, 722, 723, 724, 725, 726, 727 and 728 are at cross-points between first access lines in N=M/2+1=5 first access line layers and second access lines in P=M/2=4 second access line layers. The unidirectional memory cell 721 at the first level L1 is interposed between the first access line 701 of the first access line layer (FAL1) and the second access line 711 of the second access line layer (SAL1). The unidirectional memory cell 722 at the second level L2 is interposed between the second access line 711 of the second access line layer (SAL1) and the first access line 702 of the first access line layer (FAL2). The unidirectional memory cell 723 at the third level L3 is interposed between the first access line 702 of the first access line layer (FAL2) and the second access line 712 of the second access line layer (SAL2). The unidirectional memory cell 724 at the fourth level L4 is interposed between the second access line 712 of the second access line layer (SAL2) and the first access line 703 of the first access line layer (FAL3). The unidirectional memory cell 725 at the fifth level L5 is interposed between the first access line 703 of the first access line layer (FAL3) and the second access line 713 of the second access line layer (SAL3). The unidirectional memory cell 726 at the sixth level L6 is interposed between the second access line 713 of the second access line layer (SAL3) and the first access line 704 of the first access line layer (FAL4). The unidirectional memory cell 727 at the seventh level L7 is interposed between the first access line 704 of the first access line layer (FAL4) and the second access line 714 of the second access line layer (SAL4). The unidirectional memory cell 728 at the eight level L8 is interposed between the second access line 714 of the second access line layer (SAL4) and the first access line 705 of the first access line layer (FAL5).

The shared decoder 751 for first access line layers comprises the first and second sets of first access line drivers. The first set of first access line drivers includes driver(s) 752 coupled to apply common operational voltages to the first access line 701 in the odd first access line layer (FAL1), the first access line 703 in the odd first access line layer (FAL3), and the first access line 705 in the odd first access line layer (FAL5). The second set of first access line drivers includes driver(s) 753 coupled to apply common operational voltages to the first access line 702 in the even first access line layer (FAL2) and the first access line 704 in the even first access line layer (FAL4).

The shared decoder 761 for second access line layers comprises M/4=2 sets of second access line drivers. The first set of second access line drivers includes a driver(s) 762 coupled to apply common operational voltages to the second access line 711 in the second access line layer (SAL1) and to the second access line 712 in the second access line layer (SAL2). The second set of second access line drivers includes a driver(s) 763 coupled to apply common operational voltages to the second access line 713 in the second access line layer (SAL3) and to the second access line 714 in the second access line layer (SAL4).

FIG. 7B illustrates example operational voltages applied to first and second access lines in the stack of unidirectional cells 771 with M=8 eight levels as illustrated in FIG. 7A. As can be seen, for a read operations of a memory cell in any level, common operational voltages are applied to sets of first access line layers, including a first set including odd layers FAL1, FAL3, and FAL5, a second set including even layers FAL2 and FAL4. Also, for a read operation of a memory cell in any level, common operational voltages are applied to sets of second access line layers, including a first set including the layers SAL1 and SAL2, and the second set including layer SAL3 and SAL4. Thus the decoding burden is decreased to selection of two sets of first access line layers from selection of five first access line layers, and selection of two sets of second access line layers from a selection of four second access line layers.

Figure 8:
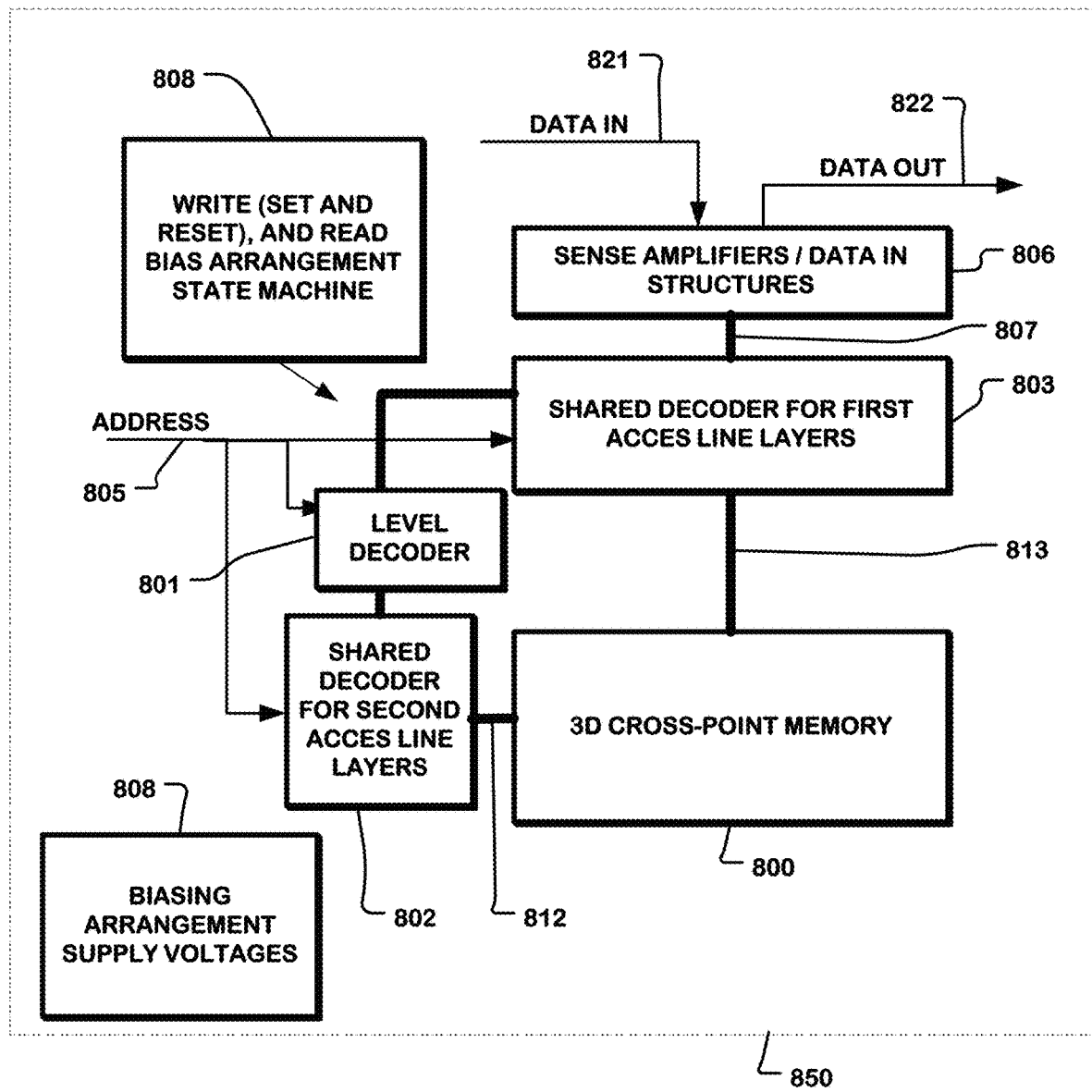
FIG. 8 is a simplified block diagram of an integrated circuit according to an embodiment of the present invention.

FIG. 8 is a simplified block diagram of an integrated circuit 850 including a 3D cross-point memory array 800. The 3D cross-point memory array 800 comprises unidirectional memory cells in some embodiments and bidirectional cells in other embodiments.

A shared level decoder 801 is coupled to and in electrical communication with a shared decoder for second access line layers 802 and a shared decoder for first access line layers 803, implemented as described above to reduce the decoding burden for the 3D array. The shared decoder for second access line layers 802 is coupled to, and in electrical communication with, a plurality of second access lines arranged as rows in the 3D cross-point array 800. The second access line decoder 802 can comprise a plurality of sets of second access line drivers. The first access line decoder 803 is coupled to and in electrical communication with a plurality of first access lines arranged as columns in the 3D cross-point array 800. The first access line decoder 803 can comprise a first set of first access line drivers and a second set of first access line drivers. Addresses are supplied on bus 805 to the level decoder 801, the shared decoder for second access line layers 802, and the shared decoder for first access line layers 803. Sense amplifiers and other supporting circuitry such as pre-charge circuits and so on, along with data-in structures in block 806, are coupled to the shared decoder for first access line layers 803 via the bus 807 in this embodiment. In some embodiments, the sense amplifiers can be independent of the data-in structures in block 806.

Data is supplied via the data-in line 821 from input/output ports on the integrated circuit 850 or other data sources, to the data-in structures in block 806. Data is supplied via the data-out line 822 from the sense amplifiers in block 806 to input/output ports on the integrated circuit 850, or to other data destinations internal or external to the integrated circuit 850.

A bias arrangement state machine is in control circuitry 808, controlling biasing arrangement supply voltages 808 as described herein. Also, the control circuitry coordinates the operation of sense circuitry and the data-in structures in block 806, for read and write operations, including executing the method of FIG. 4. The circuitry can be implemented using special purpose logic, a general purpose processor or a combination thereof, configured to execute the read, write and erase operations.

While the present technology is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the technology and the scope of the following claims.

What is claimed is:

1. A memory circuit comprising:
   a three-dimensional cross-point memory array having at least M levels of memory cells disposed in cross points of first and second access lines;
   N first access line layers for the M levels, where first access line layer (n), for n going from 1 to N, includes a plurality of first access lines coupled to corresponding rows of memory cells;
   P second access line layers for the M levels interleaved with the N first access line layers, where second access line layer (p), for p going from 1 to P, includes a plurality of second access lines coupled to corresponding columns of memory cells;
   decoder and driver circuitry configured to apply common operational voltages to selected first access lines in a set of first access line layers, the set of first access line layers having more than one member and less than N members, the selected first access lines being on different first access line layers in the set of first access line layers; and
   the decoder and driver circuitry configured to apply operational voltages to selected second access lines in the second access line layers.

2. The memory circuit of claim 1, wherein to select a particular memory cell in the M levels that is disposed in a cross point of a particular first access line in a particular first access line layer with a particular second access line, when the particular first access line layer is a member of the set of first access line layers, the decoder and driver circuitry is configured to select a row of memory cells, a column of memory cells, the set of first access line layers, and one or more second access line layers including the particular second access line.

3. The memory circuit of claim 2, wherein the decoder and driver circuitry includes a first access line driver operatively connected to first access lines in a common row in more than one first access line layer in the set of first access line layers, and is configured to enable the first access line driver to apply the common operational voltages to the first access lines in the common row in more than one first access line layer in the set of first access line layers.

4. The memory circuit of claim 2, wherein the decoder and driver circuitry includes a plurality of first access line drivers, where a first access line driver in the plurality of first access line drivers is operatively connected to a first access line in a given row in only one first access line layer in the set of first access line layers, and is configured to enable the plurality of first access line drivers to apply the common operational voltages to all first access lines in the set of first access line layers.

5. The memory circuit of claim 1, wherein the set of first access line layers includes odd first access line layers (n), where n is odd, and wherein the decoder and driver circuitry is further configured to apply common operational voltages to selected first access lines in a second set of first access line layers, the second set of first access line layers including even first access line layers (n), where n is even.

6. The memory circuit of claim 1, wherein the memory cells in the three-dimensional memory array comprise a memory element comprising a programmable resistance material.

7. The memory circuit of claim 1, wherein the decoder and driver circuitry is configured to apply common operational voltages to selected second access lines in a set of second access line layers, the set of the second access line layers having more than one member and less than P members, the selected second access lines being on different second access line layers in the set of second access line layers.

8. The memory circuit of claim 7, wherein the set of second access line layers includes second access line layers (p), where p is 1 and M/2+1.

9. The memory circuit of claim 1, wherein the memory cells in the array are unidirectional, and wherein the decoder and driver circuitry is configured to apply common operational voltages to second access lines in a plurality of sets of the second access line layers, the plurality of sets of the second access line layers comprises M/4 sets of the second access line layers; and
   wherein each set of the second access line layers of the M/4 sets of the second access line layers including a pair of the second access line layers, the pair of the second access line layers including second access line layer (p) and second access layer (p+1).

10. A method for operating a three-dimensional cross point memory array having at least M levels of memory cells disposed in cross points of first and second access lines, the array including N first access line layers for the M levels, where first access line layer (n), for n going from 1 to N, includes a plurality of first access lines coupled to corresponding rows of memory cells; and P second access line layers for the M levels interleaved with the N first access line layers, where second access line layer (p), for p going from 1 to P, includes a plurality of second access lines coupled to corresponding columns of memory cells; the method comprising:
  applying common operational voltages to selected first access lines in a set of first access line layers, the set of first access line layers having more than one member and less than N members, the selected first access lines being on different first access line layers in the set of first access line layers; and
  applying operational voltages to selected second access lines in the second access line layers.

11. The method of claim 10, including selecting a particular memory cell in the M levels that is disposed in a cross point of a particular first access line in a particular first access line layer with a particular second access line, when the particular first access line layer is a member of the set of first access line layers, by selecting a row of memory cells, a column of memory cells, the set of first access line layers, and one or more second access line layers including the particular second access line.

12. The method of claim 10, wherein the set of first access line layers includes odd first access line layers (n), where n is odd, and further including applying common operational voltages to selected first access lines in a second set of first access line layers, the second set of first access line layers including even first access line layers (n), where n is even.

13. The method of claim 10, wherein the memory cells in the three-dimensional memory array comprise a memory element comprising a programmable resistance material.

14. The method of claim 10, including applying common operational voltages to selected second access lines in a set of second access line layers, the set of second access line layers having more than one member and less than P members, the selected second access lines being on different second access line layers in the set of second access line layers.

15. The method of claim 14, wherein the set of second access line layers includes second access line layers (p), where p is 1 and M/2+1.

16. The method of claim 10, wherein the memory cells in the array are unidirectional, and including applying common operational voltages to second access lines in a plurality of sets of the second access line layers, the plurality of sets of the second access line layers comprises M/4 sets of the second access line layers; and
  wherein each set of the second access line layers of the M/4 sets of the second access line layers including a pair of the second access line layers, the pair of the second access line layers including second access line layer (p) and second access line layer (p+1).

17. A memory circuit comprising:
  a three-dimensional cross-point memory array having at least M levels of memory cells disposed in cross points of first and second access lines;
  N first access line layers for the M levels, where first access line layer (n), for n going from 1 to N, includes a plurality of first access lines coupled to corresponding rows of memory cells;
  P second access line layers for the M levels interleaved with the N first access line layers, where second access line layer (p), for p going from 1 to P, includes a plurality of second access lines coupled to corresponding columns of memory cells;
  decoder and driver circuitry configured to apply common operational voltages to selected first access lines in a set of first access line layers, the set of first access line layers having more than one member and less than N members, the selected first access lines being on different first access line layers in the set of first access line layers, wherein the set of first access line layers includes odd first access line layers (n), where n is odd; and
  the decoder and driver circuitry configured to apply common operational voltages to second access lines in a given column in a plurality of sets of the second access line layers, the plurality of sets of second access line layers comprises M/4 sets of second access line layers, wherein each set of second access line layers of the M/4 sets of second access line layers including a pair of second access line layers, the pair of second access line layers including second access line layer (p) and second access layer (p+1).

18. The memory circuit of claim 17, wherein to select a particular memory cell in the M levels that is disposed in a cross point of a particular first access line in a particular first access line layer with a particular second access line, when the particular first access line layer is a member of the set of first access line layers, the decoder and driver circuitry is configured to select a row of memory cells, a column of memory cells, the set of first access line layers, and one or more second access line layers including the particular second access line.

19. The memory circuit of claim 17, wherein the memory cells in the three-dimensional memory array comprise a memory element comprising a programmable resistance material.

20. The memory circuit of claim 17, wherein the decoder and driver circuitry is further configured to apply common operational voltages to selected first access lines in a given row in a second set of the first access line layers, the second set of the first access line layers including even first access line layers (n), where n is even.

* * * * *